(12) United States Patent
Chi et al.

(10) Patent No.: US 11,264,413 B2
(45) Date of Patent: Mar. 1, 2022

(54) DISPLAY DEVICE HAVING COMMON ELECTRODE OVERLAPPING CAPACITOR ELECTRODE AND PIXEL ELECTRODE

(71) Applicant: Au Optronics Corporation, Hsinchu (TW)

(72) Inventors: Yu-Min Chi, Hsinchu (TW); Sung-Yu Su, Tainan (TW); Pin-Miao Liu, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/535,067

(22) Filed: Aug. 8, 2019

(65) Prior Publication Data

US 2020/0052008 A1 Feb. 13, 2020

Related U.S. Application Data

(60) Provisional application No. 62/717,260, filed on Aug. 10, 2018.

(30) Foreign Application Priority Data

Feb. 20, 2019 (TW) .................. 108105694

(51) Int. Cl.
*H01L 27/12* (2006.01)
*G02F 1/1335* (2006.01)
(Continued)

(52) U.S. Cl.
CPC ........ *H01L 27/1255* (2013.01); *G02F 1/1368* (2013.01); *G02F 1/13624* (2013.01);
(Continued)

(58) Field of Classification Search
CPC ............... H01L 27/1255; H01L 27/124; G02F 1/133512; G02F 1/136213; G02F 1/13624;
(Continued)

(56) References Cited

U.S. PATENT DOCUMENTS 9,647,009 B1  5/2017  Zhao et al.
9,658,497 B2  5/2017  Wang et al.
(Continued)

FOREIGN PATENT DOCUMENTS

CN  202563218  11/2012
CN  103676359  12/2015
(Continued)

*Primary Examiner* — Lex H Malsawma
*Assistant Examiner* — Eric W Jones
(74) *Attorney, Agent, or Firm* — JCIPRNET

(57) ABSTRACT

A display device includes a substrate, a first data line, a scan line, a first sub-pixel, a passivation layer, and a common electrode. The first sub-pixel includes a first main-driving element, a first sub-driving element, a first capacitor electrode, and a first pixel electrode. The first main-driving element includes a first main-gate, a first main-channel layer, a first main-source, and a first main-drain. The first sub-driving element includes a first sub-gate, a first sub-channel layer, a first sub-source, and a first sub-drain. The first capacitor electrode is electrically connected with the first main-drain and the first sub-source. The first pixel electrode is electrically connected with the first sub-drain. The common electrode and the first capacitor electrode have a first main capacitor therebetween. The common electrode and the first pixel electrode have a first sub capacitor therebetween.

18 Claims, 8 Drawing Sheets

(51) Int. Cl.
*G02F 1/1362* (2006.01)
*G02F 1/1368* (2006.01)

(52) U.S. Cl.
CPC .. *G02F 1/133512* (2013.01); *G02F 1/136213* (2013.01); *G02F 1/136286* (2013.01); *H01L 27/124* (2013.01); *G02F 2201/52* (2013.01)

(58) Field of Classification Search
CPC ............. G02F 1/136286; G02F 1/1368; G02F 2201/52
USPC .............................................. 257/40, 59, 71
See application file for complete search history.

(56) References Cited

U.S. PATENT DOCUMENTS

| | | | |
|---|---|---|---|
| 9,997,546 | B2 | 6/2018 | Lan |
| 10,453,392 | B2* | 10/2019 | Xu ...................... G09G 3/3266 |
| 2003/0156087 | A1* | 8/2003 | Boer ........................ G06F 3/042 |
| | | | 345/92 |
| 2004/0169798 | A1* | 9/2004 | Iwasa ................. G02F 1/136277 |
| | | | 349/113 |
| 2006/0220014 | A1* | 10/2006 | Hirano .............. G02F 1/136213 |
| | | | 257/59 |
| 2007/0296901 | A1* | 12/2007 | Seo ................... G02F 1/136259 |
| | | | 349/141 |
| 2014/0204303 | A1* | 7/2014 | Koide ............... G02F 1/136286 |
| | | | 349/43 |
| 2015/0346528 | A1* | 12/2015 | Ge ....................... G02F 1/13439 |
| | | | 349/39 |
| 2016/0033827 | A1 | 2/2016 | Wang et al. |
| 2016/0307518 | A1* | 10/2016 | Kimura ............... H01L 29/7869 |
| 2017/0212397 | A1 | 7/2017 | Cao |
| 2018/0053795 | A1 | 2/2018 | Lan |
| 2019/0123072 | A1 | 4/2019 | Li et al. |

FOREIGN PATENT DOCUMENTS

| | | |
|---|---|---|
| CN | 105527767 | 4/2016 |
| CN | 105679765 | 6/2016 |
| CN | 106886111 | 6/2017 |
| CN | 207352947 | 5/2018 |

* cited by examiner

DISPLAY DEVICE HAVING COMMON ELECTRODE OVERLAPPING CAPACITOR ELECTRODE AND PIXEL ELECTRODE

CROSS-REFERENCE TO RELATED APPLICATION

This application claims the priority benefit of U.S. provisional application Ser. No. 62/717,260, filed on Aug. 10, 2018, and Taiwan application serial no. 108105694, filed on Feb. 20, 2019. The entirety of each of the above-mentioned patent applications is hereby incorporated by reference herein and made a part of this specification.

BACKGROUND

Field of the Invention

The invention relates to a display device and more particularly, to a display device having a common electrode overlapping with capacitor electrodes and pixel electrodes.

Description of Related Art

In recent years, along with continuous advancement of display technologies, viewers' demands on resolutions of display devices are increased. In order to increase a resolution of a display device, a size of each sub-pixel in the display device has to be reduced. However, small-sized sub-pixels usually have relatively small storage capacitance, which easily causes an issue of a large feed through voltage or an issue of crosstalk, and even worse, causes occurrence of a situation of current leakage.

Reducing a frame rate may facilitate reducing power consumption of the display device, thereby increasing a usage time of the display device. However, if the storage capacitance in the display device is too small or the display device has current leakage, it is difficult to reduce the frame rate due to the storage capacitance having insufficient capability of maintaining voltage. Therefore, in order to increase the usage time of the display device in high resolution, currently, there is an urgent need to improve the issue of leakage of small-sized sub-pixels.

SUMMARY

The invention provides a display device capable of improving the issue of leakage.

According to an embodiment of the invention, a display device including a substrate, a first data line, a scan line, a first sub-pixel, a passivation layer, and a common electrode is provided. The first data line and the scan line are located on the substrate. The first sub-pixel is located on the substrate. The first sub-pixel includes a first main-driving element, a first sub-driving element, a first capacitor electrode, and a first pixel electrode. The first main-driving element includes a first main-gate, a first main-channel layer, a first main-source, and a first main-drain. The first main-gate is electrically connected with the scan line. The first main-channel layer overlaps with the first main-gate. The first main-source and the first main-drain are electrically connected with the first main-channel layer. The first main-source is electrically connected with the first data line. The first sub-driving element includes a first sub-gate, a first sub-channel layer, a first sub-source, and a first sub-drain. The first sub-gate is electrically connected with the scan line. The first sub-channel layer overlaps with the first sub-gate. The first sub-source and the first sub-drain are electrically connected with the first sub-channel layer. The first main-drain is electrically connected with the first sub-source. The first capacitor electrode is electrically connected with the first main-drain and the first sub-source. The first pixel electrode is electrically connected with the first sub-drain. The passivation layer is located on the first main-source, the first main-drain, the first sub-source and the first sub-drain. The first capacitor electrode and the first pixel electrode are located on the passivation layer. The common electrode overlaps with the first capacitor electrode and the first pixel electrode. The common electrode and the first capacitor electrode have a first main-capacitor therebetween. The common electrode and the first pixel electrode have a first sub-capacitor therebetween. A material of the first capacitor electrode, the first pixel electrode and the common electrode includes a transparent conductive material.

To sum up, the first sub-source of the first sub-driving element is electrically connected with the first capacitor electrode, and the first sub-drain is electrically connected with the first pixel electrode, thereby reducing a voltage difference between the first sub-drain and the first sub-source by the first main-capacitor between the common electrode and the first capacitor electrode to improve the issue of current leakage, such that even though a voltage is stopped from applying to the scan line (i.e., the first main-driving element and the first sub-driving element are turned off), a voltage on the first pixel electrode can still be maintained for a period of time. In this way, an energy loss can be reduced by reducing the frame rate of the display device.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
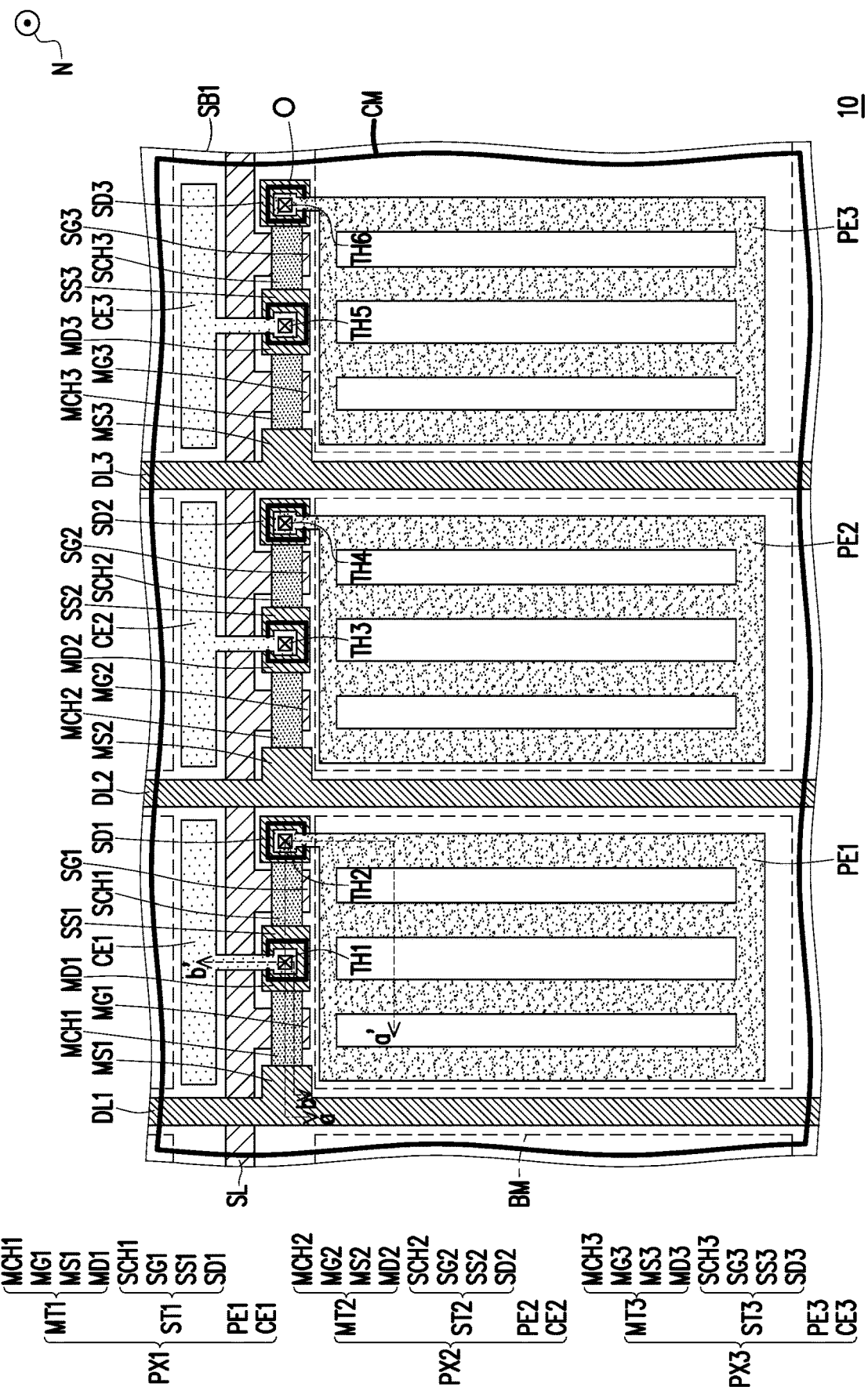
FIG. 1A is a schematic top-view diagram illustrating a display device according to an embodiment of the invention.
Figure 1B:
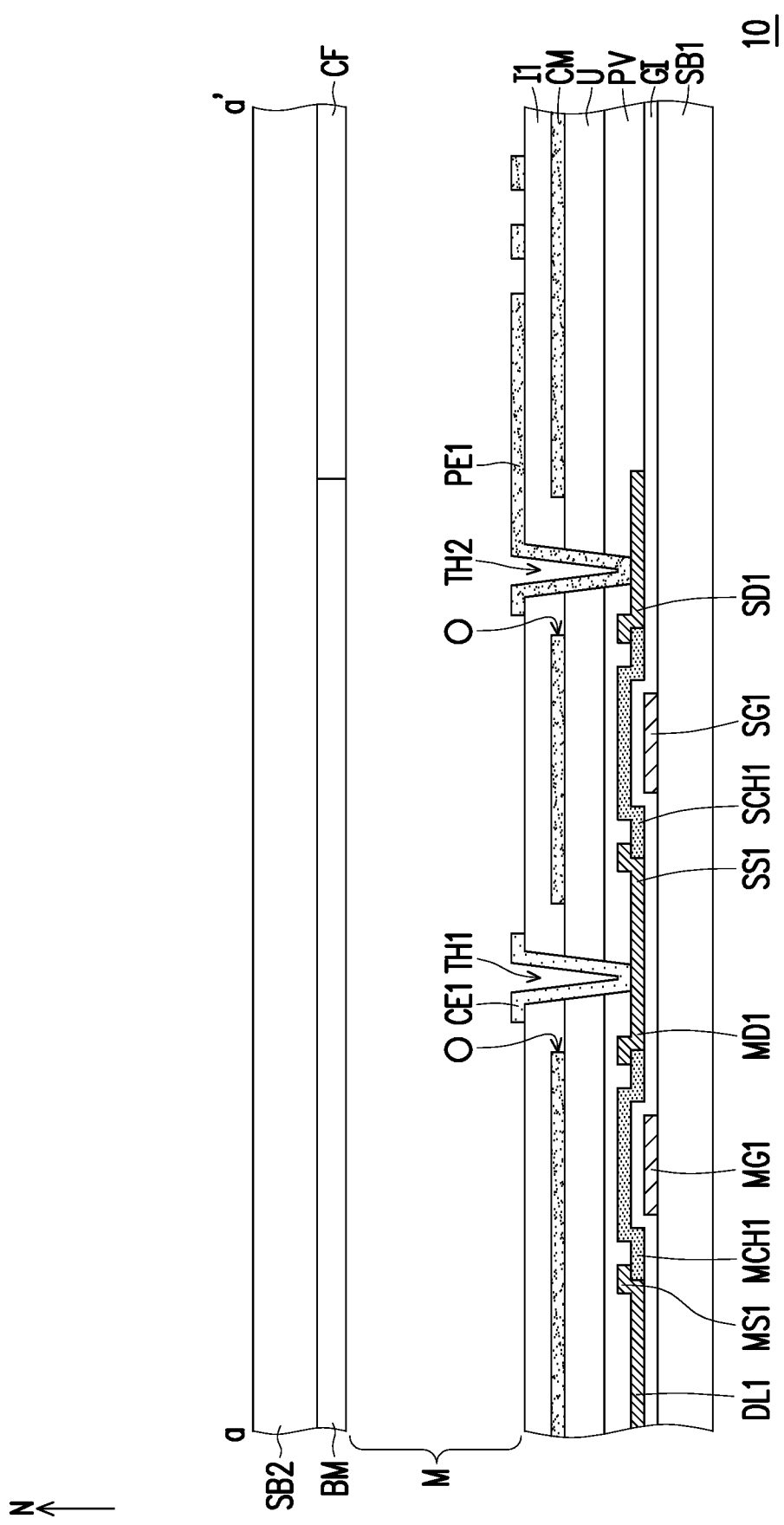
FIG. 1B is a schematic cross-sectional diagram taken along line aa' in FIG. 1A.
Figure 1C:
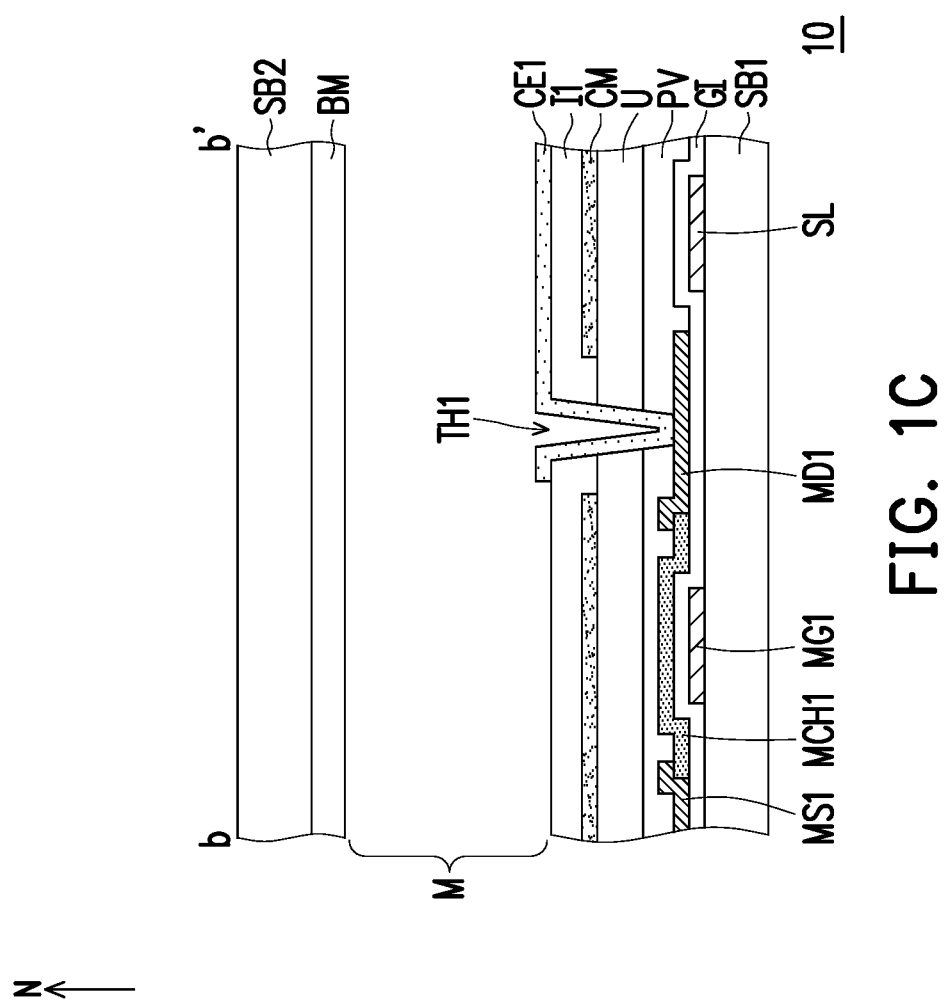
FIG. 1C is a schematic cross-sectional diagram taken along line bb' in FIG. 1A.

FIG. 1A is a schematic top-view diagram illustrating a display device according to an embodiment of the invention. FIG. 1B is a schematic cross-sectional diagram taken along line aa' in FIG. 1A. FIG. 1C is a schematic cross-sectional diagram taken along line bb' in FIG. 1A. For descriptive convenience, a part of elements in the display device are omitted from FIG. 1A.

A display device 10 includes a substrate SB1, a first data line DL1, a scan line SL, a first main-gate MG1, a first sub-gate SG1, a first main-channel layer MCH1, a gate insulating layer GI, a first main-source MS1, a first main-drain MD1, a first sub-source SS1, a first sub-drain SD1, a passivation layer PV, a first capacitor electrode CE1, a first pixel electrode PE1 and a common electrode CM. In the present embodiment, the display device 10 further includes a second data line DL2, a third data line DL3, a second main-gate MG2, a second sub-gate SG2, a second main-channel layer MCH2, a second sub-channel layer SCH2, a second main-source MS2, a second main-drain MD2, a second sub-source SS2, a second sub-drain SD2, a second capacitor electrode CE2, a second pixel electrode PE2, a third main-gate MG3, a third sub-gate SG3, a third main-channel layer MCH3, a third sub-channel layer SCH3, a third main-source MS3, a third main-drain MD3, a third sub-source SS3, a third sub-drain SD3, a third capacitor electrode CE3, a third pixel electrode PE3, an insulating layer U, a first dielectric material layer I1, a display medium layer M, an opposite substrate SB2, a black matrix BM and a color conversion element CF.

In the present embodiment, taking three sub-pixels of the display device 10 as an example for description, a first sub-pixel PX1, a second sub-pixel PX2 and a third sub-pixel PX3 are located on the substrate SB1. The first sub-pixel PX1 includes a first main-driving element MT1, a first sub-driving element ST1, the first capacitor electrode CE1 and the first pixel electrode PE1, the second sub-pixel PX2 includes a second main-driving element MT2, a second sub-driving element ST2, the second capacitor electrode CE2 and the second pixel electrode PE2, and the third sub-pixel PX3 includes a third main-driving element MT3, a third sub-driving element ST3, the third capacitor electrode CE3 and the third pixel electrode PE3.

The first main-gate MG1, the first main-channel layer MCH1, the first main-source MS1 and the first main-drain MD1 form the first main-driving element MT1. The first sub-gate SG1, the first sub-channel layer SCH1, the first sub-source SS1 and the first sub-drain SD1 form the first sub-driving element ST1. The second main-gate MG2, the second main-channel layer MCH2, the second main-source MS2 and the second main-drain MD2 form the second main-driving element MT2. The second sub-gate SG2, the second sub-channel layer SCH2, the second sub-source SS2 and the second sub-drain SD2 form the second sub-driving element ST2. The third main-gate MG3, the third main-channel layer MCH3, the third main-source MS3 and the third main-drain MD3 form the third main-driving element MT3. The third sub-gate SG3, the third sub-channel layer SCH3, the third sub-source SS3 and the third sub-drain SD3 form the third sub-driving element ST3.

The first main-driving element MT1, the first sub-driving element ST1, the second main-driving element MT2, the second sub-driving element ST2, the third main-driving element MT3, the third sub-driving element ST3, the first data line DL1, the second data line DL2, the third data line DL3 and the scan line SL are located on the substrate SB1.

The first main-gate MG1 and the first sub-gate SG1 are electrically connected with the scan line SL. The first main-channel layer MCH1 and the first sub-channel layer SCH1 respectively overlap with the first main-gate MG1 and the first sub-gate SG1 in a direction N perpendicular to the substrate SB1. The gate insulating layer GI is located between the first main-gate MG1 and the first main-channel layer MCH1 and between the first sub-gate SG1 and the first sub-channel layer SCH1. The first main-source MS1 and the first main-drain MD1 are electrically connected with the first main-channel layer MCH1. The first main-source MS1 is electrically connected with the first data line DL1. The first sub-source SS1 and the first sub-drain SD1 are electrically connected with the first sub-channel layer SCH1. The first main-drain MD1 is electrically connected with the first sub-source SD1. In the present embodiment, the first main-drain MD1 and the first sub-source SD1 are substantially connected as one piece.

The second main-gate MG2 and the second sub-gate SG2 are electrically connected with the scan line SL. The second main-channel layer MCH2 and the second sub-channel layer SCH2 respectively overlap with the second main-gate MG2 and the second sub-gate SG2 in the direction N perpendicular to the substrate SB1. The gate insulating layer GI is located between the second main-gate MG2 and the second main-channel layer MCH2 and between the second sub-gate SG2 and the second sub-channel layer SCH2. The second main-source MS2 and the second main-drain MD2 are electrically connected with the second main-channel layer MCH2. The second main-source MS2 is electrically connected with the second data line DL2. The second sub-source SS2 and the second sub-drain SD2 are electrically connected with the second sub-channel layer SCH2. The second main-drain MD2 is electrically connected with the second sub-source SD2. In the present embodiment, the second main-drain MD2 and the second sub-source SD2 are substantially connected as one piece.

The third main-gate MG3 and the third sub-gate SG3 are electrically connected with the scan line SL. The third main-channel layer MCH3 and the third sub-channel layer SCH3 respectively overlap with the third main-gate MG3 and the third sub-gate SG3 in the direction N perpendicular to the substrate SB1. The gate insulating layer GI is located between the third main-gate MG3 and the third main-channel layer MCH3 and between the third sub-gate SG3 and the third sub-channel layer SCH3. The third main-source MS3 and the third main-drain MD3 are electrically connected with the third main-channel layer MCH3. The third main-source MS3 is electrically connected with the third data line DL3. The third sub-source SS3 and the third sub-drain SD3 are electrically connected with the third sub-channel layer SCH3. The third main-drain MD3 is electrically connected with the third sub-source SD3. In the present embodiment, the third main-drain MD3 and the third sub-source SD3 are substantially connected as one piece.

The first main-channel layer MCH1, the first sub-channel layer SCH1, the second main-channel layer MCH2, the second sub-channel layer SCH2, the third main-channel layer MCH3 and the third sub-channel layer SCH3 are respectively single-layer structures or multi-layer structures and are made of amorphous silicon, poly-silicon, microcrystalline silicon, monocrystalline silicon, an organic semiconductor material, an oxide semiconductor material (e.g., indium zinc oxide (IZO), indium gallium zinc oxide (IGZO), or other adaptive materials, or a combination thereof), or other adaptive materials, or the aforementioned materials containing dopants or a combination of the aforementioned materials.

The first data line DL1, the second data line DL2, the third data line DL3, the scan line SL, the first main-gate MG1, the first sub-gate SG1, the second main-gate MG2, the second sub-gate SG2, the third main-gate MG3, the third sub-gate SG3, the first main-source MS1, the first sub-source MD1, the first sub-source SS1, the first sub-drain SD1, the second main-source MS2, the second main-drain MD2, the second sub-source SS2, the second sub-drain SD2, the third main-source MS3, the third main-drain MD3, the third sub-source SS3 and the third sub-drain SD3 are respectively single-layer structures or multi-layer structures and made of a metal, such as chromium, gold, silver, copper, tin, lead, hafnium, tungsten, molybdenum, neodymium, titanium, tantalum, aluminum, zinc, an alloy of the aforementioned metals, an oxide of the aforementioned metals, or a nitride of the aforementioned metals, or a combination of the aforementioned materials or other conductive materials.

In the present embodiment, the main-driving elements and the sub-driving elements are bottom-gate thin film transistors, for example, but the invention is not limited thereto. In the other embodiments, the main-driving elements and the sub-driving elements may be top-gate thin film transistors, dual-gate thin film transistors or other types of thin film transistors. In the other embodiments, each main-driving element is not limited to be a single thin film transistor, and each main-driving element may be composed of two or more thin film transistors connected in series. Similarly, each sub-driving element is not limited to be a single thin film transistor, and each sub-driving element may be composed of two or more thin film transistors connected in series.

The passivation layer PV is located on the first main-source MS1, the first sub-source MD1, the first sub-source SS1, the first sub-drain SD1, the second main-source MS2, the second main-drain MD2, the second sub-source SS2, the second sub-drain SD2, the third main-source MS3, the third main-drain MD3, the third sub-source SS3 and the third sub-drain SD3.

The insulating layer U is located on the passivation layer PV. The insulating layer U is, for example, an organic insulating layer, but the invention is not limited thereto.

The common electrode CM is located on the insulating layer U. The common electrode CM has a plurality of openings O, and the openings O are disposed corresponding to positions of the first sub-drain MD1, the first sub-source SS1, the first sub-drain SD1, the second main-drain MD2, the second sub-source SS2, the second sub-drain SD2, the third main-drain MD3, the third sub-source SS3 and the third sub-drain SD3.

The first dielectric material layer I1 is located on the common electrode CM. The first capacitor electrode CE1, the first pixel electrode PE1, the second capacitor electrode CE2, the second pixel electrode PE2, the third capacitor electrode CE3 and the third pixel electrode PE3 are located above the passivation layer PV. In the present embodiment, the insulating layer U, the first dielectric material layer I1 and the common electrode CM are further sandwiched between the first capacitor electrode CE1, the first pixel electrode PE1, the second capacitor electrode CE2, the second pixel electrode PE2, the third capacitor electrode CE3 and the third pixel electrode PE3 and the passivation layer PV. In the present embodiment, the first capacitor electrode CE1, the first pixel electrode PE1, the second capacitor electrode CE2, the second pixel electrode PE2, the third capacitor electrode CE3 and the third pixel electrode PE3 belong to the same layer, which in other words, may be formed in the same mask process, thereby mitigating the influence caused by process offset to optical quality. In the present embodiment, the first capacitor electrode CE1, the first pixel electrode PE1, the second capacitor electrode CE2, the second pixel electrode PE2, the third capacitor electrode CE3, the third pixel electrode PE3 and the common electrode CM are made of a transparent conductive material, such as indium tin oxide, indium zinc oxide, or other metal oxide or a combination of the aforementioned materials.

In the present embodiment, the first pixel electrode PE1, the second pixel electrode PE2 and the third pixel electrode PE3 are located at one side of the scan line SL, and a part of the first capacitor electrode CE1, a part of the second capacitor electrode CE2 and a part of the third capacitor electrode CE3 are located at the other side of the scan line SL.

The first capacitor electrode CE1 is electrically connected with the first main-drain MD1 and the first sub-source SS1. For instance, the first capacitor electrode CE1 is electrically connected with the first main-drain MD1 and the first sub-source SS1 through a first through hole TH1. The first pixel electrode PE1 is electrically connected with the first sub-drain SD1. For instance, the first pixel electrode PE1 is electrically connected with the first sub-drain SD1 through a second through hole TH2.

The second capacitor electrode CE2 is electrically connected with the second main-drain MD2 and the second sub-source SS2. For instance, the second capacitor electrode CE2 is electrically connected with the second main-drain MD2 and the second sub-source SS2 through a third through hole TH3. The second pixel electrode PE2 is electrically connected with the second sub-drain SD2. For instance, the second pixel electrode PE2 is electrically connected with the second sub-drain SD2 through a fourth through hole TH4.

The third capacitor electrode CE3 is electrically connected with the third main-drain MD3 and the third sub-source SS3. For instance, the third capacitor electrode CE3 is electrically connected with the third main-drain MD3 and the third sub-source SS3 through a fifth through hole TH5. The third pixel electrode PE3 is electrically connected with the third sub-drain SD3. For instance, the third pixel electrode PE3 is electrically connected with the third sub-drain SD3 through a sixth through hole TH6.

In the present embodiment, the first through hole TH1, the second through hole TH2, the third through hole TH3, the fourth through hole TH4, the fifth through hole TH5 and the sixth through hole TH6 penetrate the passivation layer PV, the insulating layer U and the first dielectric material layer I1. The first through hole TH1, the second through hole TH2, the third through hole TH3, the fourth through hole TH4, the fifth through hole TH5 and the sixth through hole TH6 are disposed corresponding to the openings O of the common electrode CM. In the present embodiment, the first through hole TH1 and the second through hole TH2 are arranged along an extension direction of the scan line SL, the third through hole TH3 and the fourth through hole TH4 are arranged along the extension direction of the scan line SL, and the fifth through hole TH5 and the sixth through hole TH6 are arranged along the extension direction of the scan line SL, thereby mitigating the influence caused by the aforementioned through holes to an aperture ratio.

In the present embodiment, the common electrode CM overlaps with the first capacitor electrode CE1, the first pixel electrode PE1, the second capacitor electrode CE2, the second pixel electrode PE2, the third capacitor electrode CE3 and the third pixel electrode PE3 in the direction N perpendicular to the substrate SB1. The common electrode CM and the first capacitor electrode CE1 have a first main capacitor therebetween, and a capacitance value thereof is M1. The common electrode CM and the first pixel electrode PE1 have a first sub capacitor therebetween, and a capacitance value thereof is S1. The common electrode CM and the second capacitor electrode CE2 have a second main capacitor therebetween, and a capacitance value thereof is M2. The common electrode CM and the second pixel electrode PE2 have a second sub capacitor therebetween, and a capacitance value thereof is S2. The common electrode CM and the third capacitor electrode CE3 have a third main capacitor therebetween, and a capacitance value thereof is M3. The common electrode CM and the third pixel electrode PE3 have a third sub capacitor therebetween, and a capacitance value thereof is S3. In the present embodiment, S1=S2=S3.

With the configuration of the first main capacitor, the second main capacitor and the third main capacitor, sustainability of voltages on the pixel electrodes may be increased. For instance, a voltage difference between the first sub-drain SD1 and the first sub-source SS1 may be reduced by the first main capacitor between the common electrode CM and the first capacitor electrode CE1 to improve an issue of current leakage, such that even though a voltage is stopped from applying to the scan line SL (i.e., the first main-driving element MT1 and the first sub-driving element ST1 are turned off), a voltage on the first pixel electrode PE1 may be still maintained for a period of time. Thus, an energy loss may be reduced by reducing a frame rate of the display device 10.

In some embodiments, in order to enhance an effect of preventing the current leakage, a charging effect and optical quality of pixels simultaneously, S1, M1, S2, M2, S3 and M3 satisfy relational equations as follows: 10% of S1<M1≤60% of S1, 10% of S2<M2≤60% of S2, and 10% of S3<M3≤60% of S3.

The opposite substrate SB2 is disposed facing the substrate SB1. The black matrix BM and the color conversion element CF are located above the substrate SB1. The black matrix BM and the color conversion element CF are disposed on the opposite substrate SB2. The display medium layer M is sandwiched between the opposite substrate SB2 and the substrate SB1. The display medium layer M includes, for example, liquid crystal molecules.

In the present embodiment, the black matrix BM overlaps with the scan line SL, the first capacitor electrode CE1, the first data line DL1, the first main-driving element MT1, the first sub-driving element ST1, the second capacitor electrode CE2, the second data line DL2, the second main-driving element MT2, the second sub-driving element ST2, the third capacitor electrode CE3, the third data line DL3, the third main-driving element MT3 and the third sub-driving element ST3 in the direction N perpendicular to the substrate SB1.

In the present embodiment, a part of the first capacitor electrode CE1, a part of the second capacitor electrode CE2 and a part of the third capacitor electrode CE3 are parallel to the scan line SL, and the first capacitor electrode CE1, the second capacitor electrode CE2 and the third capacitor electrode CE3 are disposed adjacent to the scan line SL. Thus, an area of the black matrix BM does not have to be large to cover the first capacitor electrode CE1, the second capacitor electrode CE2, the third capacitor electrode CE3 and the scan line SL, thereby mitigating the influence caused by the aforementioned capacitor electrodes to the aperture ratio. In the present embodiment, the part of the first capacitor electrode CE1, the part of the second capacitor electrode CE2 and the part of the third capacitor electrode CE3 which are parallel to the scan line SL do not overlap with the scan line SL in the direction N perpendicular to the substrate SB1, but the invention is not limited thereto. In the other embodiments, the part of the first capacitor electrode CE1, the part of the second capacitor electrode CE2 and the part of the third capacitor electrode CE3 which are parallel to the scan line SL may overlap with the scan line SL in the direction N perpendicular to the substrate SB1, thereby further mitigating the influence caused by the aforementioned capacitor electrodes to the aperture ratio. In the present embodiment, the first pixel electrode PE1, the second pixel electrode PE2 and the third pixel electrode PE3 are located corresponding to openings of the black matrix BM.

The color conversion layer CF, for example, includes a variety of colors and includes, for example, a red color conversion layer, a green color conversion layer and a blue color conversion layer. In the present embodiment, the first sub-pixel PX1, the second sub-pixel PX2 and the third sub-pixel PX3 respectively correspond to the red color conversion layer, the green color conversion layer and the blue color conversion layer. In other words, the first sub-pixel PX1 is a red sub-pixel, the second sub-pixel PX2 is a green sub-pixel, and the third sub-pixel PX3 is a blue sub-pixel.

In the present embodiment, by adjusting the capacitance value M1 of the first main capacitor, the capacitance value M2 of the second main capacitor and the capacitance value M3 of the third main capacitor, the sub-pixels in different colors may have preferable optical quality. For instance, the capacitance value M1 is not equal to the capacitance value M2 nor to the capacitance value M3, and the capacitance value M2 is not equal to the capacitance value M3. In the present embodiment, regarding the first main capacitor, the second main capacitor and the third main capacitor, a material of the dielectric layer (e.g., the first dielectric material layer I1) between each two electrodes (e.g., the capacitor electrode and the common electrode) is the same, such that by adjusting areas of the first capacitor electrode CE1, the second capacitor electrode CE2 and the third capacitor electrode CE3, or by disposing openings with different sizes on the first capacitor electrode CE1, the second capacitor electrode CE2 and the third capacitor electrode CE3, the capacitance value M1, the capacitance value M2 and the capacitance value M3 may be adjusted. For instance, a ratio of the capacitance value M1, the capacitance value M2 and the capacitance value M3 may be equal to an area ratio of the capacitance value M1, the capacitance value M2 and the capacitance value M3, but the invention is not limited thereto.

In some embodiments, since the third sub-pixel PX3 (i.e., the blue sub-pixel) flickers less obviously due to having a low brightness, the third sub-pixel PX3 may have a preferable charging rate by adjusting the capacitance value M3 of the third main capacitor to be smaller than the capacitance value M1 of the first main capacitor and the capacitance value M2 of the second main capacitor. For instance, S1, M1, S2, M2, S3 and M3 may satisfy relational equations as follows: 12% of S1<M1≤50% of S1, 12% of S2<M2≤50% of S2, and 10% of S3<M3≤40% of S3.

In some embodiments, since the second sub-pixel PX3 (i.e., the green sub-pixel) flickers more obviously due to having a high brightness, the flickering issue of the second sub-pixel PX2 may be improved by adjusting the capacitance value M2 of the second main capacitor to be greater than the capacitance value M1 of the first main capacitor and the capacitance value M3 of the third main capacitor. For instance, S1, M1, S2, M2, S3 and M3 may satisfy relational equations as follows: 10% of S1<M1≤50% of S1, 12% of S2<M2≤60% of S2, and 10% of S3<M3≤50% of S3.

Figure 2:
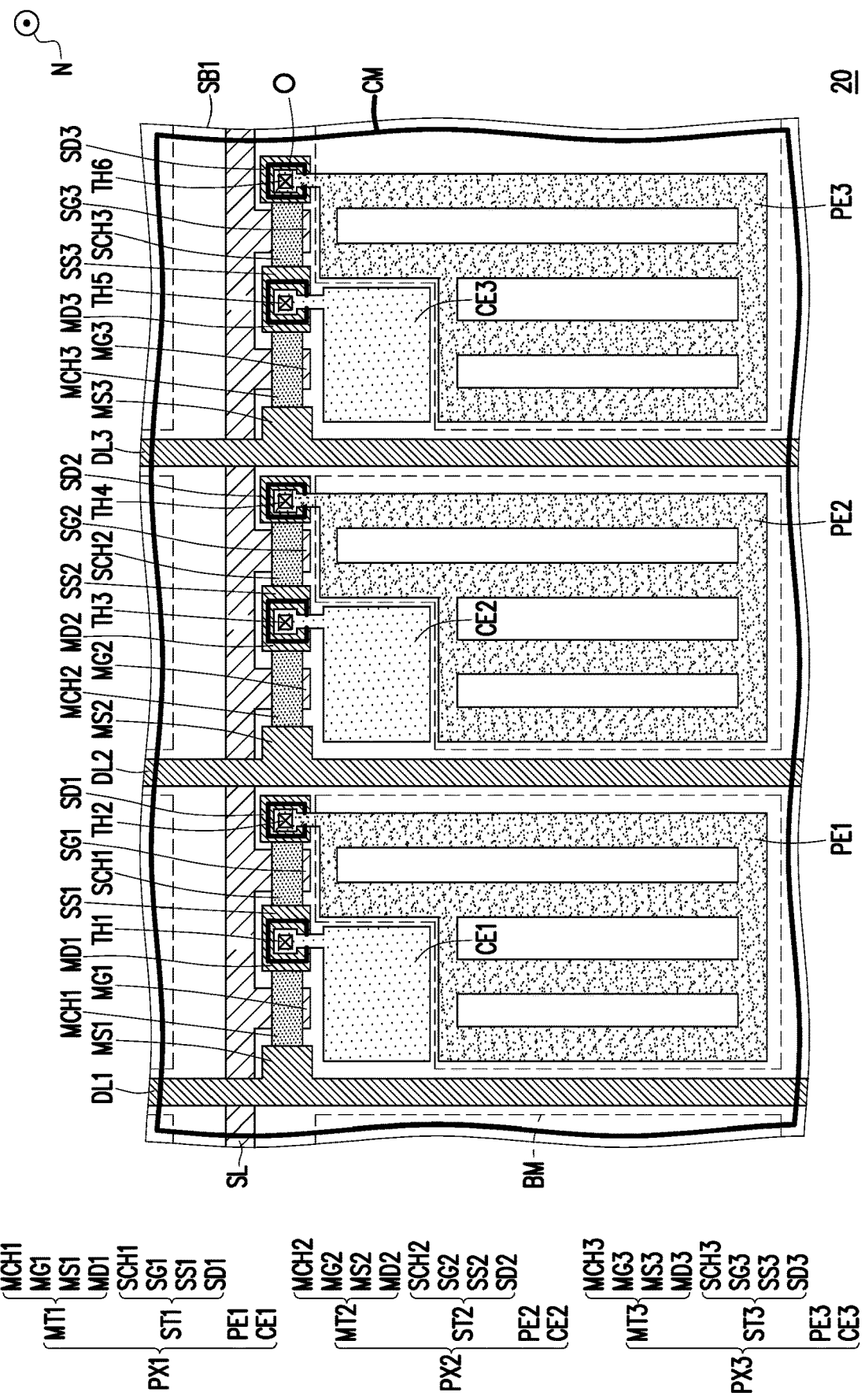
FIG. 2 is a schematic top-view diagram illustrating a display device according to an embodiment of the invention.

FIG. 2 is a schematic top-view diagram illustrating a display device according to an embodiment of the invention. It should be noted that in the embodiment illustrated in FIG.

2, element numerals and part of the contents related to the previous embodiment illustrated in FIG. 1A through FIG. 1C are referenced hereafter, where the same or similar elements are represented by using the same or similar reference numerals, and the description with respect to the same technical content is omitted. Regarding the detailed description of the omitted parts, reference may be found in the previous embodiment and will not be repeated below.

A display device 20 illustrated in FIG. 2 is mainly different from the display device 10 illustrated in FIG. 1A in that the first capacitor electrode CE1, the first pixel electrode PE1, the second capacitor electrode CE2, the second pixel electrode PE2, the third capacitor electrode CE3 and the third pixel electrode PE3 are all located at the same side of the scan line SL.

In the present embodiment, a first main capacitor and a first sub capacitor are arranged along the extension direction of the scan line SL, a second main capacitor and a second sub capacitor are arranged along the extension direction of the scan line SL, and a third main capacitor and a third sub capacitance are arranged along the extension direction of the scan line SL.

In the display apparatus 20, the flexibility for adjusting a capacitance value M1 of the first main capacitor, a capacitance value S1 of the first sub capacitor, a capacitance value M2 of the second main capacitor, a capacitance value S2 of the second sub capacitor, a capacitance value M3 of the third main capacitor and a capacitance value S3 of the third sub capacitor is much more than that of the display device 10. The rest description may be inferred with reference to the description related to the previous embodiment and will not be repeated hereinafter.

Figure 3A:
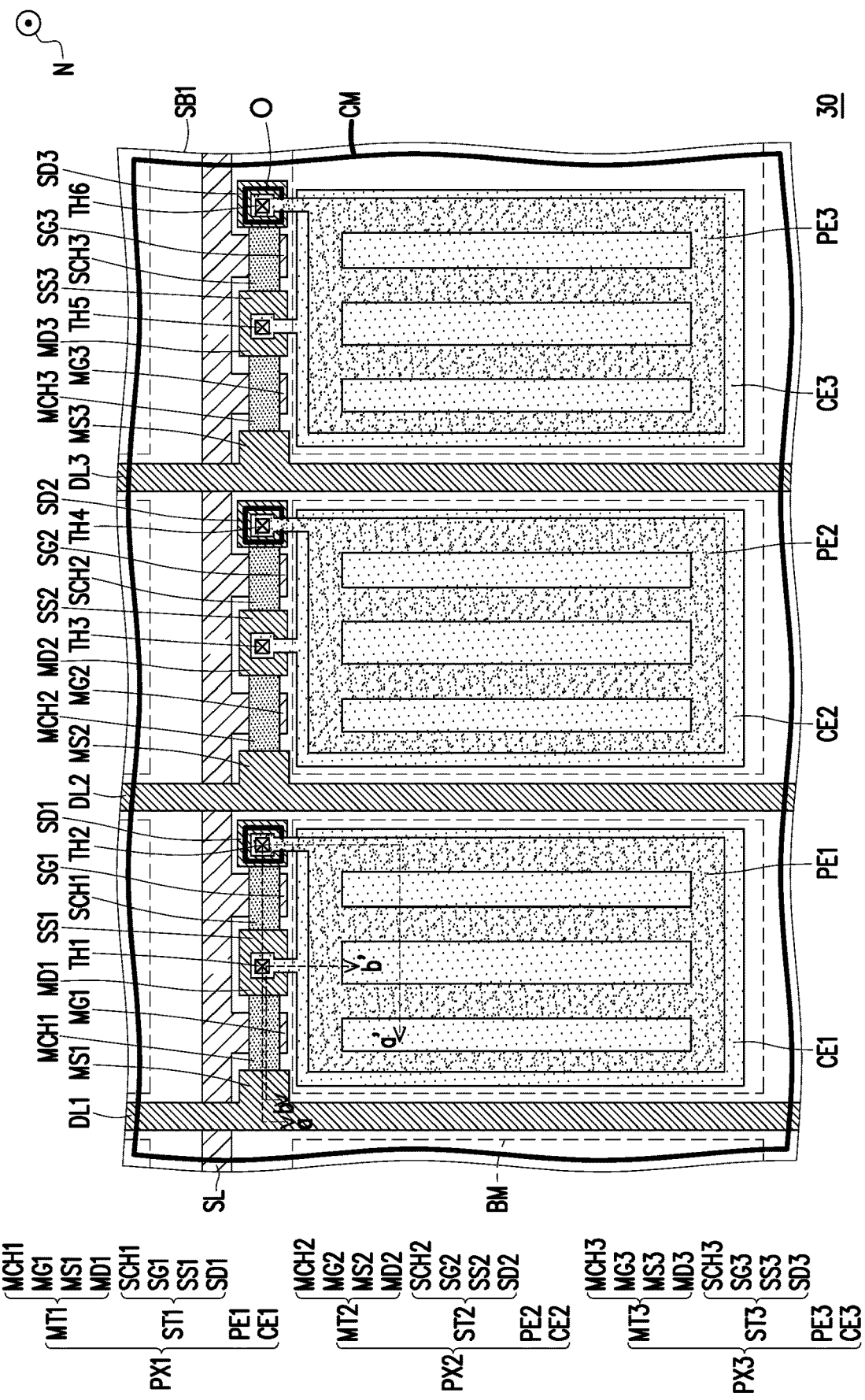
FIG. 3A is a schematic top-view diagram illustrating a display device according to an embodiment of the invention.
Figure 3B:
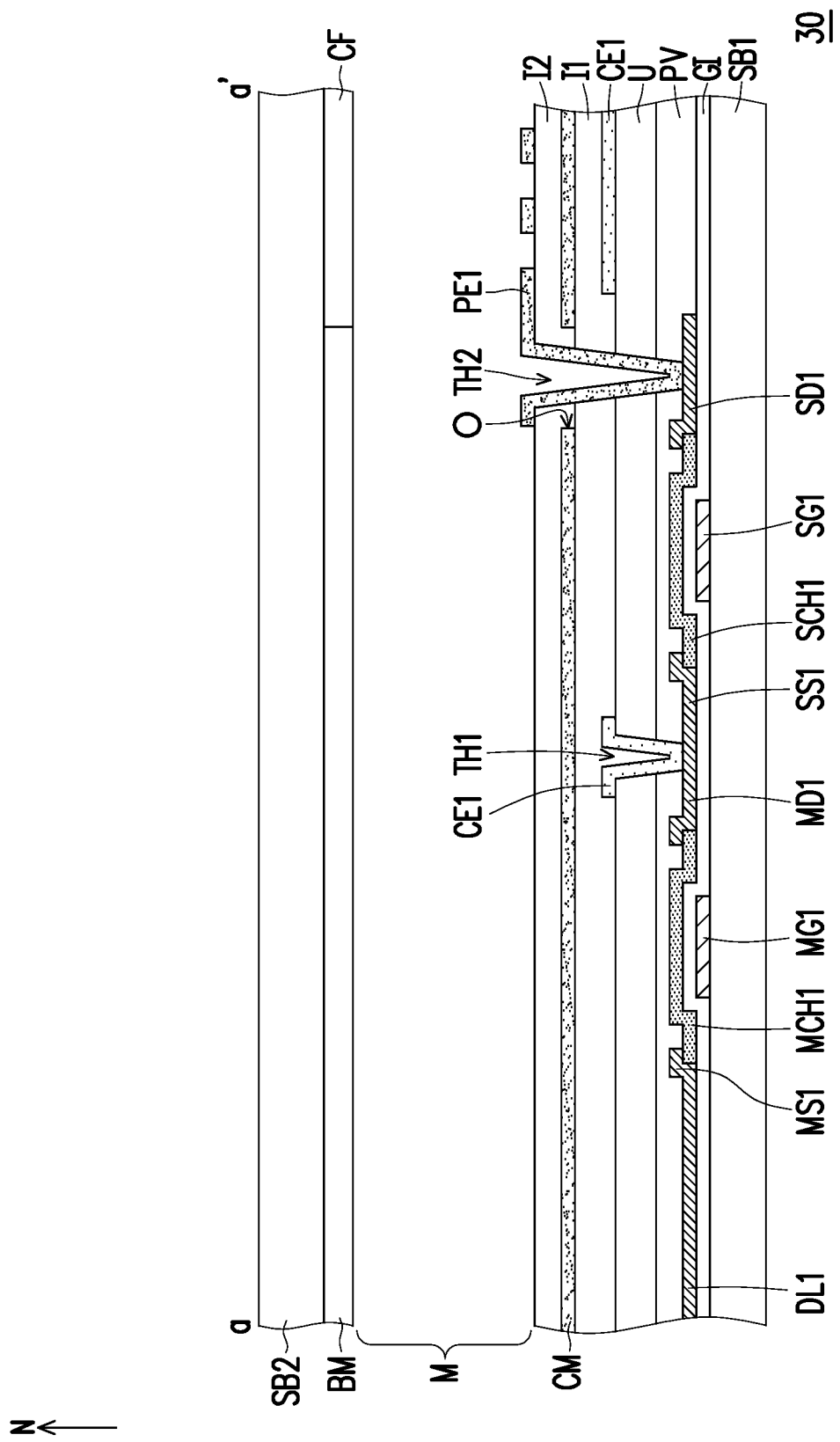
FIG. 3B is a schematic cross-sectional diagram taken along line aa' in FIG. 3A.
Figure 3C:
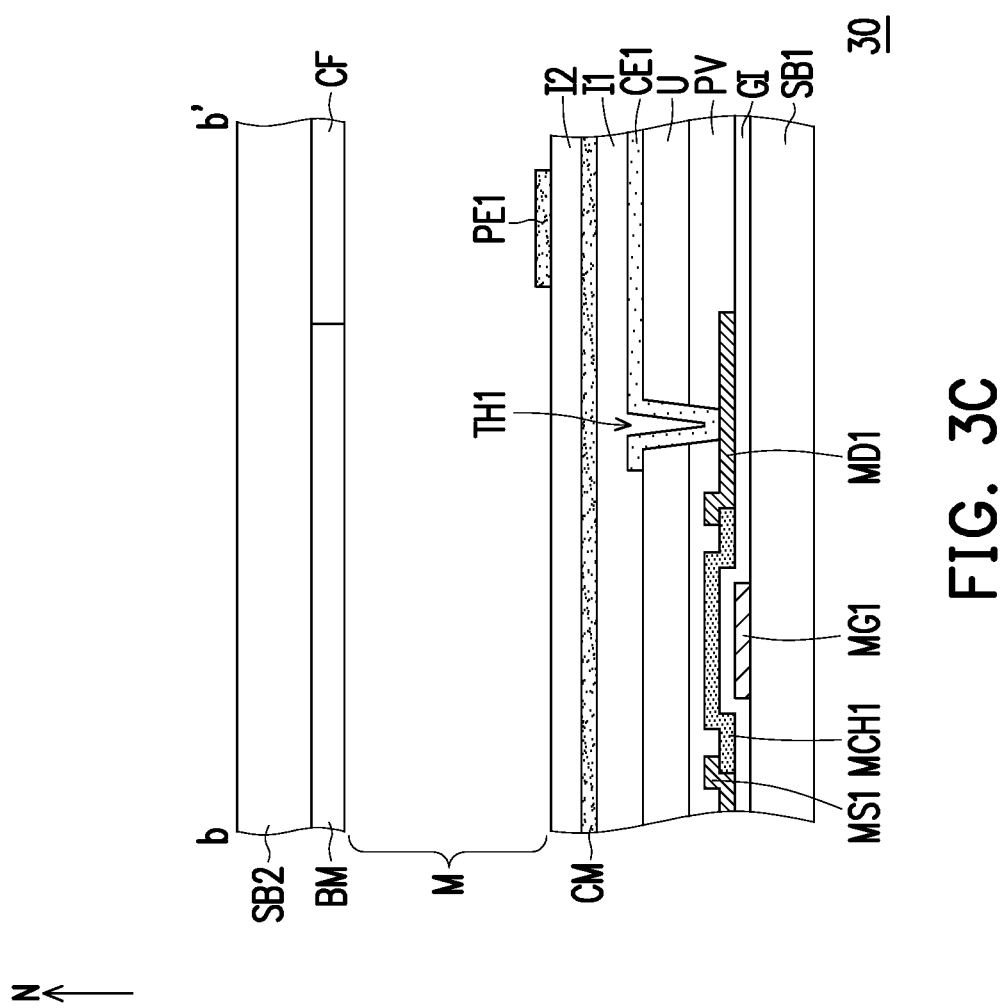
FIG. 3C is a schematic cross-sectional diagram taken along line bb' in FIG. 3A.

FIG. 3A is a schematic top-view diagram illustrating a display device according to an embodiment of the invention. FIG. 3B is a schematic cross-sectional diagram taken along line aa' in FIG. 3A. FIG. 3C is a schematic cross-sectional diagram taken along line bb' in FIG. 3A. It should be noted that in the embodiment illustrated in FIG. 3A through FIG. 3C, element numerals and part of the contents related to the previous embodiment illustrated in FIG. 1A through FIG. 1C are referenced hereafter, where the same or similar elements are represented by using the same or similar reference numerals, and the description with respect to the same technical content is omitted. Regarding the detailed description of the omitted parts, reference may be found in the previous embodiment and will not be repeated below.

A display device 30 illustrated in FIG. 3A through FIG. 3C is mainly different from the display device 10 illustrated in FIG. 1A through FIG. 1C in that the display apparatus 30 further includes a second dielectric material layer I2.

Referring through FIG. 3A through FIG. 3C, the first capacitor electrode CE1, the second capacitor electrode CE2 and the third capacitor electrode CE3 are located above the insulating layer U. The first dielectric material layer I1 is located on the first capacitor electrode CE1, the second capacitor electrode CE2 and the third capacitor electrode CE3. The common electrode CM is located on the first dielectric material layer I1. The second dielectric material layer I2 is located on the common electrode CM. The first pixel electrode PE1, the second pixel electrode PE2 and the third pixel electrode PE3 are located on the second dielectric material layer I2.

The first capacitor electrode CE1, the second capacitor electrode CE2 and the third capacitor electrode CE3 belong to the same layer, which in other words, may be formed in the same mask process. In the present embodiment, the first pixel electrode PE1, the second pixel electrode PE2 and the third pixel electrode PE3 belong to another layer, which in other words, may be formed in another mask process.

In the present embodiment, the first capacitor electrode CE1 overlaps with the common electrode CM and the first pixel electrode PE1 in the direction N perpendicular to the substrate SB1, the second capacitor electrode CE2 overlaps with the common electrode CM and the second pixel electrode PE2 in the direction N perpendicular to the substrate SB1, and the third capacitor electrode CE3 overlaps with the common electrode CM and the third pixel electrode PE3 in the direction N perpendicular to the substrate SB1. In this way, the display device 30 has an advantage of a high aperture ratio. In the present embodiment, the first capacitor electrode CE1, the second capacitor electrode CE2 and the third capacitor electrode CE3 do not easily influence disposition spaces of the first pixel electrode PE1, the second pixel electrode PE2 and the third pixel electrode PE3. The areas of the first capacitor electrode CE1, the second capacitor electrode CE2 and the third capacitor electrode CE3 are increased to increase the capacitance value M1 of the first main capacitor, the capacitance value M2 of the second main capacitor and the capacitance value M3 of the third main capacitor, thereby improving an issue of leakage of the display apparatus 30.

In the present embodiment, the capacitance value M1 of the first main capacitor, the capacitance value S1 of the first sub capacitor, the capacitance value M2 of the second main capacitor, the capacitance value S2 of the second sub capacitor, the capacitance value M3 of the third main capacitor and the capacitance value S3 of the third sub capacitor may be adjusted by adjusting materials and/or thicknesses of the first dielectric material layer I1 and the second dielectric material layer I2. The materials and/or the thicknesses of the first dielectric material layer I1 and the second dielectric material layer I2 are different to each other. The rest may be inferred with reference to the description related to the previous embodiment and will not be repeated hereinafter.

Figure 4:
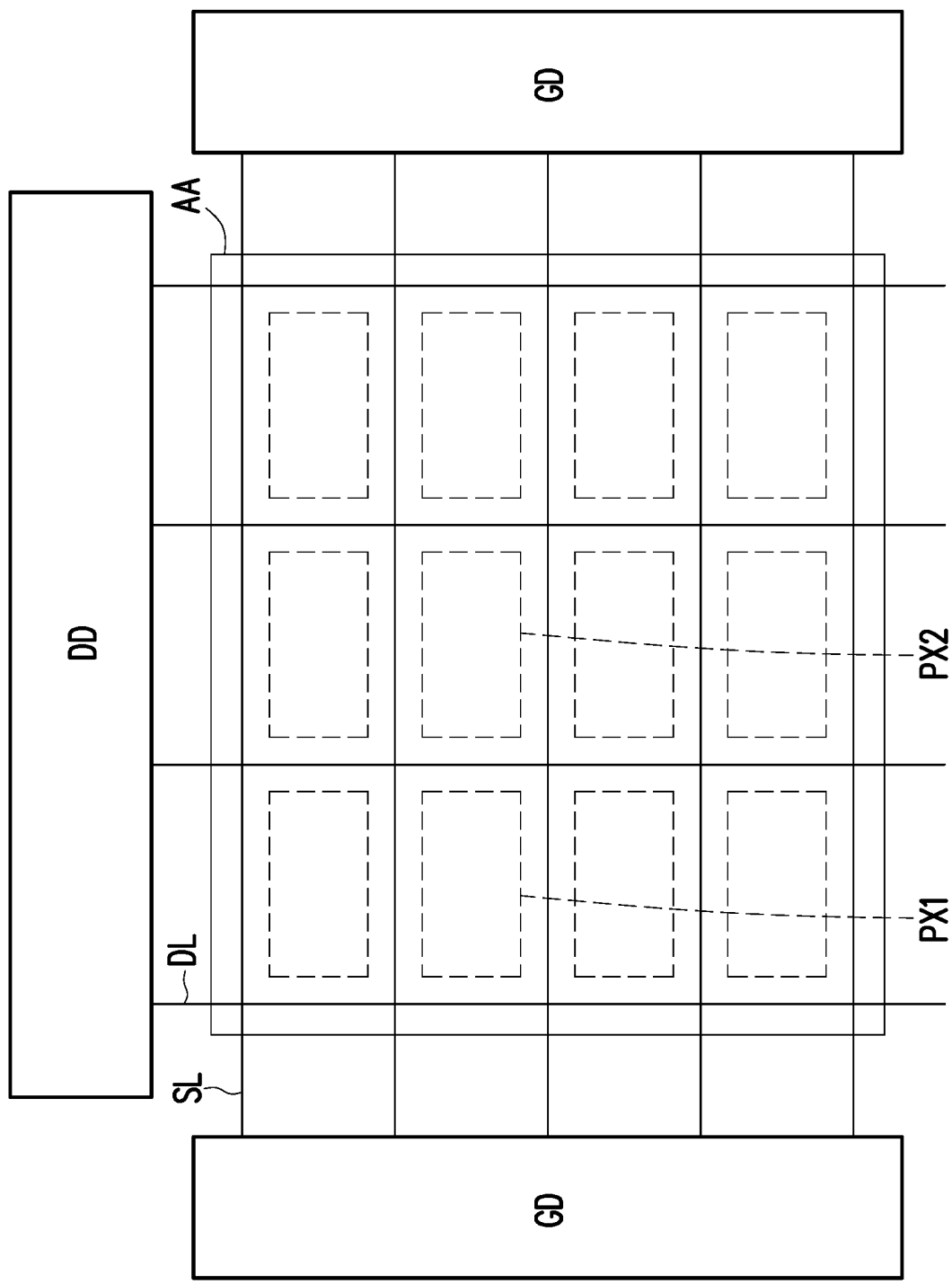
FIG. 4 is a schematic top-view diagram illustrating a display device according to an embodiment of the invention.

FIG. 4 is a schematic top-view diagram illustrating a display device according to an embodiment of the invention. It should be noted that in the embodiment illustrated in FIG. 4, element numerals and part of the contents related to the previous embodiments illustrated in FIG. 1A through FIG. 1C are referenced hereafter, where the same or similar elements are represented by using the same or similar reference numerals, and the description with respect to the same technical content is omitted. Regarding the detailed description of the omitted parts, reference may be found in the previous embodiment and will not be repeated below.

A display device 40 illustrated in FIG. 4 is mainly different from the display device 10 illustrated in FIG. 1A through FIG. 1C in that the display device 40 further includes a gate driving circuit GD and a source driving circuit DD.

The gate driving circuit GD is electrically connected with scan lines SL. The source driving circuit DD is electrically connected with data lines DL (for example, the first data line DL1, the second data line DL2 and the third data line DL3 illustrated in FIG. 1A).

In the present embodiment, the first sub-pixel PX1 is closer to the gate driving circuit GD than the second sub-pixel PX2. In other words, the first main-driving element and the first sub-driving element of the first sub-pixel PX1 are closer to the gate driving circuit GD than the second main-driving element and the second sub-driving element of the second sub-pixel PX2, and a control signal on each scan line SL, when arriving the first sub-pixel PX1, has a loss less than that when arriving the second sub-pixel PX2. Generally, in the conventional technique, due to disposition positions varying with respect to the gate driving circuit GD, a severity degree that the flickering issue of the first sub-pixel PX1 is different from that of the flickering issue of the second sub-pixel PX2. For instance, the severity degree of the flickering issue of the second sub-pixel PX2 may be smaller than that of the flickering issue of the first sub-pixel PX1.

In the present embodiment, even if the second sub-pixel PX2 is closer to a center of a display region AA, the capacitance value M1 of the first main capacitor is greater than the capacitance value M2 of the second main capacitor, thereby improving an issue of uneven brightness at different positions of the screen of the display apparatus 40.

In the present embodiment, although the display device 40 in a gate bilateral-drive mode is taken as an example, but the invention is not limited thereto. In the other embodiments, the display device may also be in a gate unilateral-drive mode.

In light of the foregoing, in the display device of the invention, the sub-sources of the sub-driving elements are electrically connected with the capacitor electrodes, and the sub-drains are electrically connected with the pixel electrodes, such that the voltage differences between the sub-drains and the sub-sources can be reduced by the main capacitors between the common electrode and the capacitor electrodes to improve the issue of current leakage. As such, even though the voltage is stopped from applying to the scan line (i.e., the main-driving elements and the sub-driving elements are turned off), the voltage of each of the pixel electrodes can still be maintained for a period of time. In this way, the energy loss can be reduced by reducing the frame rate of the display device.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A display device, comprising:
   a substrate;
   a first data line and a scan line, located on the substrate;
   a first sub-pixel, located on the substrate, wherein the first sub-pixel comprises a first main-driving element, a first sub-driving element, a first capacitor electrode and a first pixel electrode, wherein
   the first main-driving element comprises:
      a first main-gate, electrically connected with the scan line;
      a first main-channel layer, overlapping with the first main-gate; and
      a first main-source and a first main-drain, electrically connected with the first main-channel layer, wherein the first main-source is electrically connected with the first data line, and
   the first sub-driving element comprises:
      a first sub-gate, electrically connected with the scan line;
      a first sub-channel layer, overlapping with the first sub-gate; and
      a first sub-source and a first sub-drain, electrically connected with the first sub-channel layer, wherein the first main-drain and the first sub-source are substantially connected as one piece, the first capacitor electrode is electrically connected to and in contact with the first main-drain and the first sub-source through a first through hole, and the first pixel electrode is electrically connected to and in contact with the first sub-drain through a second through hole;
   a passivation layer, located on the first main-source, the first main-drain, the first sub-source and the first sub-drain, wherein the first capacitor electrode and the first pixel electrode are located on the passivation layer; and
   a common electrode, overlapping with the first capacitor electrode and the first pixel electrode, wherein the common electrode and the first capacitor electrode have a first main capacitor therebetween, the common electrode and the first pixel electrode have a first sub capacitor therebetween, and a material of the first capacitor electrode, the first pixel electrode and the common electrode comprises a transparent conductive material.

2. The display device according to claim 1, wherein a part of the first capacitor electrode is parallel to the scan line.

3. The display device according to claim 1, wherein the first capacitor electrode and the first pixel electrode are located at one side of the scan line.

4. The display device according to claim 1, wherein the first capacitor electrode and the first pixel electrode are located at different sides of the scan line.

5. The display device according to claim 1, wherein a capacitance value of the first main capacitor is M1, a capacitance value of the first sub capacitor is S1, and 10% of S1<M1≤60% of S1.

6. The display device according to claim 1, further comprising:
   a second data line and a third data line, located on the substrate;
   a second sub-pixel and a third sub-pixel, located on the substrate, wherein the second sub-pixel comprises:
      a second main-driving element and a second sub-driving element, wherein a second main-source of the second main-driving element is electrically connected with the second data line, and a second main-drain of the second main-driving element is electrically connected with a second sub-source of the second sub-driving element;
      a second capacitor electrode, electrically connecting with the second main-drain and the second sub-source;
      a second pixel electrode, electrically connected with the second sub-drain, wherein the common electrode and the second capacitor electrode have a second main capacitor therebetween, and the common electrode and the second pixel electrode have a second sub capacitor therebetween, and the third sub-pixel comprises:
   a third main-driving element and a third sub-driving element, wherein a
      third main-source of the third main-driving element is electrically connected with the third data line, and a third main-drain of the third main-driving element is electrically connected with a third sub-source of the third sub-driving element;
      a third capacitor electrode, electrically connected with the third main-drain and the third sub-source; and
      a third pixel electrode, electrically connected with the third sub-drain, wherein the common electrode and the third capacitor electrode have a third main capacitor therebetween, the common electrode and the third pixel electrode have a third sub capacitor therebetween; a capacitance value of the first main capacitor is M1, a capacitance value of the second main capacitor is M2, a capacitance value of the third main capacitor is M3, and M1 is not equal to M2 nor to M3.

7. The display device according to claim 6, wherein the first sub-pixel is a red sub-pixel, the second sub-pixel is a green sub-pixel, the third sub-pixel is a blue sub-pixel, a capacitance value of the first sub capacitor is S1, a capacitance value of the second sub capacitor is S2, and a capacitance value of the third sub capacitor is S3, wherein 12% of S1<M1≤50% of S1,
12% of S2<M2≤50% of S2, and
10% of S3<M3≤40% of S3.

8. The display device according to claim 7, wherein M3 is less than M1 and less than M2.

9. The display device according to claim 6, wherein the first sub-pixel is a red sub-pixel, the second sub-pixel is a green sub-pixel, the third sub-pixel a blue sub-pixel, a capacitance value of the first sub capacitor is S1, a capacitance value of the second sub capacitor is S2, and a capacitance value of the third sub capacitor is S3, wherein 10% of S1<M1≤50% of S1,
12% of S2<M2≤60% of S2, and
10% of S3<M3≤50% of S3.

10. The display device according to claim 9, wherein M2 is greater than M1 and greater than M3.

11. The display device according to claim 6, wherein a capacitance value of the first sub capacitor is S1, a capacitance value of the second sub capacitor is S2, a capacitance value of the third sub capacitor is S3, and S1=S2=S3.

12. The display device according to claim 6, further comprising:

a gate driving circuit, electrically connected with the scan line, wherein the first main-driving element is closer to the gate driving circuit than the second main-driving element, and M1 is greater than M2.

13. The display device according to claim 1, wherein the first capacitor electrode and the first pixel electrode belong to different layers.

14. The display device according to claim 13, further comprising:

a first dielectric material layer, located on the first capacitor electrode, and the common electrode being located on the first dielectric material layer; and a second dielectric material layer, located on the common electrode, and the first pixel electrode being located on the second dielectric material layer.

15. The display device according to claim 13, wherein the first capacitor electrode and the first pixel electrode overlap with each other in a direction perpendicular to the substrate.

16. The display device according to claim 1, wherein the first capacitor electrode and the first pixel electrode belong to the same layer.

17. The display device according to claim 16, further comprising:

a black matrix, located above the substrate, wherein the black matrix overlaps with the scan line and the first capacitor electrode in a direction perpendicular to the substrate.

18. The display device according to claim 1, wherein the first through hole and the second through hole penetrate the passivation layer, and the first through hole and the second through hole are arranged along an extension direction of the scan line.

* * * * *